(12) United States Patent
Cheng et al.

(10) Patent No.: US 9,099,531 B1
(45) Date of Patent: Aug. 4, 2015

(54) METAL ROUTING IN ADVANCED PROCESS TECHNOLOGIES

(71) Applicant: Altera Corporation, San Jose, CA (US)

(72) Inventors: Ning Cheng, San Jose, CA (US); Andy Lee, San Jose, CA (US); Fangyun Richter, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/332,266

(22) Filed: Jul. 15, 2014

(51) Int. Cl.
*H01L 21/44* (2006.01)
*H01L 21/768* (2006.01)
*H01L 21/311* (2006.01)
*H01L 23/528* (2006.01)
*H01L 21/033* (2006.01)
*H01L 21/308* (2006.01)

(52) U.S. Cl.
CPC ...... *H01L 21/76816* (2013.01); *H01L 21/0338* (2013.01); *H01L 21/3088* (2013.01); *H01L 21/31144* (2013.01); *H01L 21/76879* (2013.01); *H01L 23/528* (2013.01)

(58) Field of Classification Search
CPC ............ H01L 21/3086; H01L 21/3088; H01L 21/76816
See application file for complete search history.

(56) References Cited

U.S. PATENT DOCUMENTS

| 2011/0151668 | A1* | 6/2011 | Tang et al. | 438/671 |
| 2013/0056884 | A1* | 3/2013 | Eom | 257/782 |

\* cited by examiner

*Primary Examiner* — Reema Patel
(74) *Attorney, Agent, or Firm* — Ward & Zinna, LLC

(57) ABSTRACT

A plurality of elongated, substantially parallel mandrels are formed on a first work surface, the mandrels being spaced apart a distance in the range between the resolution limit and twice the resolution limit. Spacers are formed on the work surface extending from sidewalls of the mandrels. First portions of the work surface are exposed through gaps in the spacers near the midpoint between a majority of adjacent mandrels; but at least one pair of adjacent mandrels is close enough together that the spacers extend continuously between the adjacent mandrels. The mandrels are then removed, thereby exposing second portions of the work surface. The exposed first and second portions are etched down to a second work surface; and the exposed portions of the second work surface are etched to form trenches in that surface. A wire routing is formed by filling the trenches with a metal such as copper.

20 Claims, 4 Drawing Sheets

METAL ROUTING IN ADVANCED PROCESS TECHNOLOGIES

BACKGROUND

Line pitches smaller than approximately 66 nanometers (nm.) are beyond the theoretical capability of the 193 nm. immersion lithography optical systems used in conventional photolithography for single patterning. In order to achieve pitches smaller than 66 nm., technologies have been developed that exploit other features of the photolithographic process. One such technology is self aligned double patterning (SADP) which provides for an improvement in pitch by up to a factor of two.

In SAPD, a plurality of elongated, substantially parallel mandrels are formed on the upper surface of a first work surface. The mandrels are rectangular in cross-section with parallel sidewalls. Since there is no need to incur the added expenses of SAPD processing if the mandrels have a pitch more than twice the theoretical minimum pitch (hereinafter "TMP") of the process used to form the mandrels, the mandrels ordinarily have a pitch that is greater than TMP by no more than a factor of two. For convenience, we will refer to pitches in the range between TMP and twice TMP as the SAPD range.

Spacers are formed on the work surface that extend from the sidewalls of each mandrel toward the two adjacent mandrels. The spacers are formed using essentially the same film and etch technology used to form spacers on the sidewalls of field effect transistor gates. Since the etching process is uniform, each spacer that is formed has approximately the same extension on the work surface from the sidewall of one mandrel toward the adjacent mandrel. The etching process is performed so as to leave a gap between the spacers near the midpoints between adjacent mandrels thereby exposing first portions of the first work surface.

The spacers are then used as masks in another etching process. First, the mandrels are removed to expose second portions of the work surface that underlie the mandrels. Then, a suitable etchant is used to etch the exposed portions of the first work surface, both the portions that were under the mandrels and the portions in the gaps near the midpoints between the mandrels, down to a second work surface. The remaining portions of the first work surface are then used as a mask to etch the second work surface down to a substrate, thereby forming trenches in the second work surface. The trenches are then filled with a metal such as copper. Since the trenches are formed both underneath the regions where the mandrels were located and underneath the gaps in the spacers near the midpoints between the mandrels, the metal routing has a pitch that is one-half the pitch of the mandrels and less than the TMP.

While the SAPD process enables the formation of a wire layout having a pitch that is one-half the pitch of the mandrels, the conventional SAPD process has the disadvantage that the spacing between adjacent wires is uniform since the extension of each of the spacers is the same. However, there are many situations in which it is desirable to be able to vary the wire spacing. For example, it frequently is desirable to increase the wire spacing so as to reduce same-metal cross-capacitance and thereby improve speed and AC power and/or reduce noise coupling between adjacent lines. It is also desirable to reduce same-metal cross-capacitance for edge-sensitive signals, such as clock signals. Thus, it is desirable to be able to vary the wire spacing to provide larger spacing for signals such as clock signals, high-fanout signals, speed critical signals, and asynchronous control signals.

SUMMARY

In a preferred embodiment, the invention comprises a wire routing and a method for making it, in which the spacing between adjacent wires can be varied even while using processes such as SADP.

In an illustrative embodiment of the method, a plurality of elongated, substantially parallel mandrels are formed on a first work surface, a majority of the mandrels being spaced apart a first pitch that is in the SAPD range of the technology used to form the mandrels and at least one pair of mandrels being spaced apart by a second pitch that is less than the first pitch and also within the SAPD range. Spacers are then formed on the first work surface, each spacer extending from a sidewall of one mandrel toward an adjacent mandrel. The spacers that extend between adjacent mandrels that have the first pitch have gaps between them near the midpoint between the adjacent mandrels that expose first portions of the first work surface; and because of the uniformity of the etch process used to form the spacers, each spacer has substantially the same extension on the work surface. The mandrels having the second pitch are close enough that the spacers between these mandrels have no gap and extend continuously between the adjacent mandrels. The mandrels are then removed from the first work surface, thereby exposing second portions of the first work surface.

The exposed first and second portions of the first work surface are then etched down to a second work surface, thereby exposing portions of the second work surface; and the exposed portions of the second work surface are etched to form trenches in the second work surface. The wire routing is then formed by filling the trenches with a metal. The pitch between the wire traces in the trenches is twice the first pitch (and therefore less than the TMP) in the regions where the mandrels had the first pitch and is the second pitch in the region where the mandrels had the second pitch.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
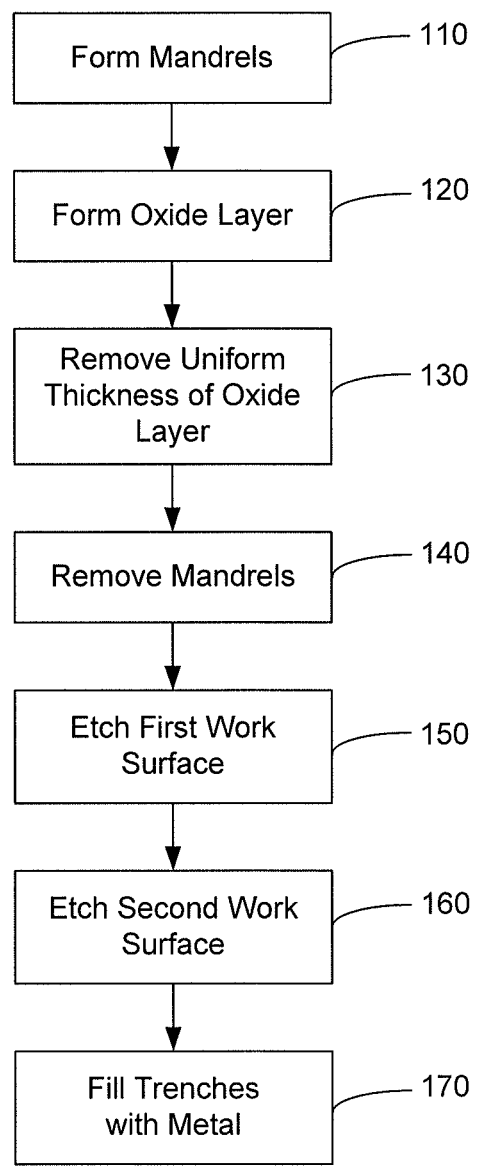
FIG. 1 is a flowchart depicting an illustrative embodiment of the invention.
Figure 2:
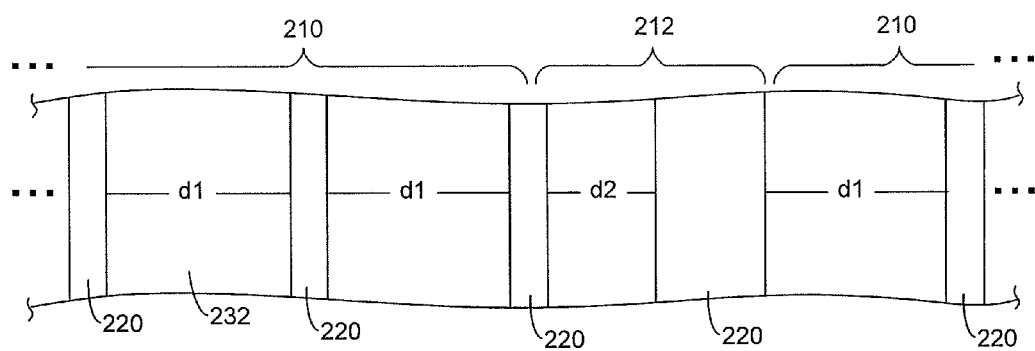
FIG. 2 is a top view of a mandrel layout used in a first illustrative embodiment of the invention.

FIG. 1 is a flowchart depicting the major steps in an illustrative embodiment of the invention. Typically, the processing that is described in FIG. 1 is performed on a wafer of a semiconductor material such as silicon that may be up to 12 inches in diameter in today's state-of-the-art processes. FIG. 2 is a top view depicting the mandrel layout used in a first illustrative embodiment of the invention; and FIGS. 3A-3G are cross-sections depicting various steps of the process of FIG. 1.

At step 110 of FIG. 1, a plurality of elongated, substantially parallel mandrels 220 (FIGS. 2 and 3) are formed on the upper surface 232 of a first work surface 230. The first work surface is formed on a second work surface 240 that, in turn, is formed on a substrate 250. Illustratively, the first and second work surfaces are different dielectric materials that have different etching properties. For example, the first work surface may be a hard mask such as silicon nitride and the second work surface silicon dioxide. Illustratively, the substrate is a wafer of a semiconductor material in which active devices such as transistors have been fabricated and on which one or more layers of a dielectric material have been formed.

The mandrels are rectangular in cross-section with parallel sidewalls 222 and upper and lower major surfaces 224, 226. A majority 210 of the mandrels are spaced apart a distance d1 that is in the SAPD range for the technology used to form the mandrels. In accordance with the invention, at least one pair 212 of mandrels and perhaps more is formed so that the distance d2 between the mandrels is significantly smaller as described below but is still within the SAPD range. As shown in FIG. 2, this decrease in distance is accomplished by making the width of at least one of the mandrels substantially larger than that of the other mandrels. The decrease in distance may also be accomplished by other methods such as those shown in FIG. 4.

Figure 3A:
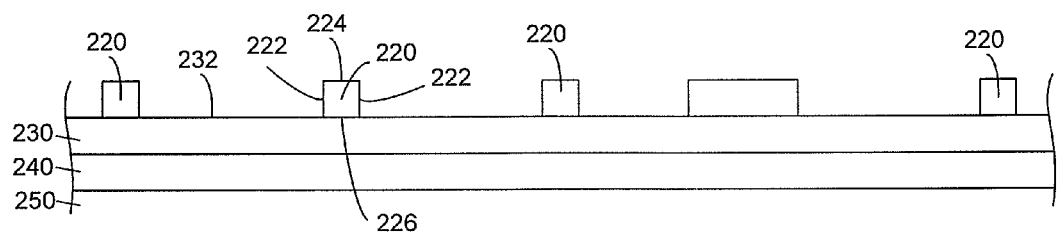
FIGS. 3A-3G are cross-sections depicting structures formed at various steps in the process depicted in FIG. 1.
Figure 3B:
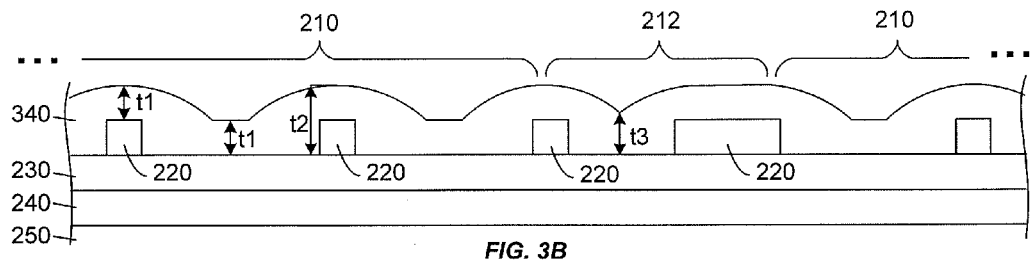

Spacers are then formed on first work surface 230 that extend from the sidewalls of each mandrel 220 toward the two adjacent mandrels. The spacers are formed using essentially the same film and etch technology used to form spacers on the sidewalls of field effect transistor gates. First, at step 120, a layer 340 of silicon oxide or similar material is deposited over the mandrels and the portions of the first work surface between the mandrels as shown in FIG. 3B.

For the majority 210 of the mandrels that are spaced apart a distance d1, this oxide layer has the same uniform thickness t1 on the top of the mandrels and in the region near the midpoint between adjacent mandrels. However, at the edges of the mandrels the thickness t2 of the oxide layer is as much as the height of the sidewall of the mandrel plus the thickness of the oxide layer on the mandrel; and it tapers off from there toward the midpoint between the mandrels.

For the pair 212 of mandrels that is spaced together by the distance d2, the oxide layer also has the same uniform thickness t1 on the top of the mandrels and a thickness t2 at the edges of the mandrels that is as much as the height of the sidewall of the mandrel and the thickness of the oxide layer on the mandrel. However, the two mandrels are close enough together that the thickness of the oxide layer does not taper off to the same thickness as that of the oxide layer on top of the mandrel. Rather, at its thinnest point between the two mandrels, the thickness t3 of the oxide layer is greater than the thickness t1 of the oxide layer on the mandrels.

Figure 3C:
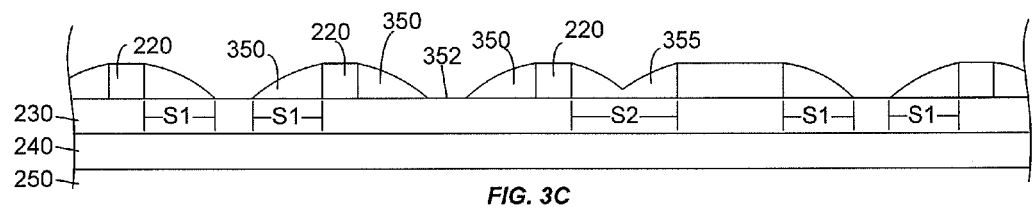

The oxide layer is then isotropically etched at step 130 using an appropriate etchant and etch time to uniformly remove a thickness t1 of the oxide layer to expose the upper surfaces 224 of the mandrels and portions of the first work surface near the midpoints between the plurality 210 of mandrels. The result at the end of etch step 130 is shown in FIG. 3C. Where the thickness of the oxide layer was greater than the thickness t1 on the mandrels, i.e., at the edges of the mandrels, portions of the oxide layer remain to form spacers 350 that extend from the sidewalls of the mandrels toward the adjacent mandrels. For the majority 210 of the mandrels, since the etching process is uniform, each spacer that is formed has approximately the same extension s1 on the work surface from the sidewall of one mandrel toward the adjacent mandrel; and there is a gap 352 between the spacers that extend from adjacent mandrels through which a first portion 232 of the first work surface is exposed. Thus, the distance d1 between adjacent mandrels in the majority 210 of mandrels is more than twice the extension s1. However, between the pair 212 of mandrels that are spaced apart the distance d2 where the minimum thickness t3 of the oxide layer is greater than the thickness t1 of the oxide layer on the mandrels, there is a continuous spacer 355 between the mandrels. Spacer 355 has an extension s2 on the work surface that is greater than extension s1 and less than twice s1.

Figure 3D:
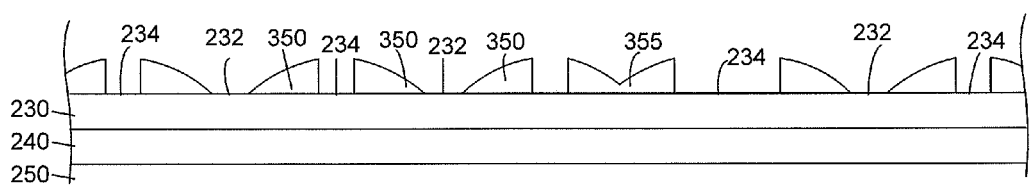
Figure 3E:
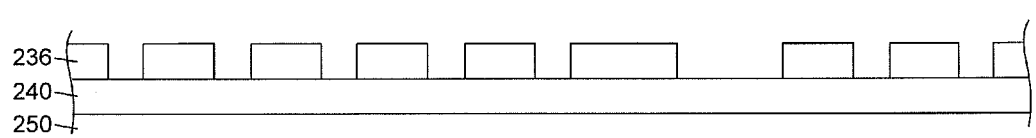
Figure 3F:
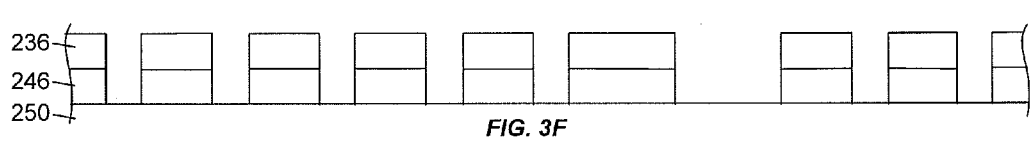
Figure 3G:
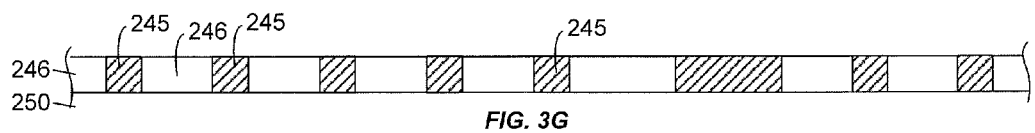

The spacers 350, 355 are then used as masks in another etching process. First, the mandrels are removed at step 140 to expose second portions 234 of the first work surface that underlie the mandrels as shown in FIG. 3D. Then, a suitable etchant is used at step 150 to etch the exposed portions of the first work surface, both the first portions 232 in the gaps near the midpoints between the mandrels and the second portions 234 that were under the mandrels, down to the second work surface 240 as shown in FIG. 3E. Next, using the remaining portions 236 of the first work surface as a mask, at step 160 another etchant etches the second work surface down to substrate 250, thereby forming trenches 242 in the second work surface as shown in FIG. 3F. The remaining portions 236 of the first work surface are then removed, the trenches 242 are filled with a metal 245 such as copper, and the excess metal is removed down to the upper surface of the remaining portions 246 of the second work surface as shown in FIG. 3G. Since the trenches are formed both underneath the regions where the mandrels were located and underneath the regions near the midpoints between the mandrels where gaps in the spacers were formed, the metal routing has a pitch that is one-half the pitch of the mandrels in the region where the plurality 210 of mandrels were formed. And in each region where the spacing between a pair 212 of mandrels did not permit formation of a gap, the spacing between the metals is the same as the spacing between the mandrels.

Figure 4:
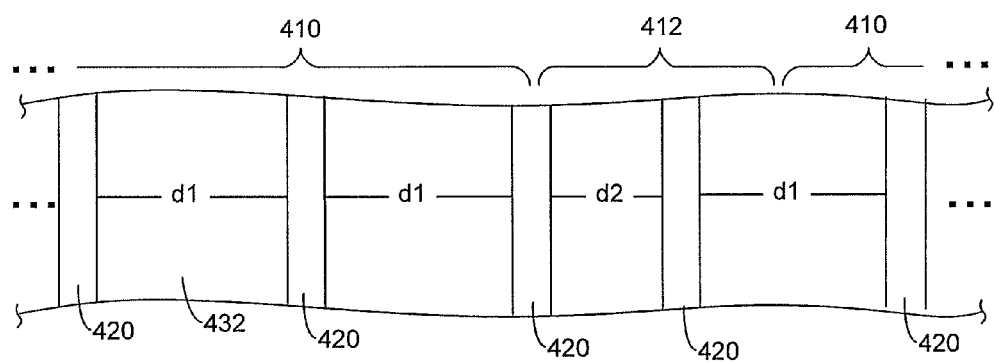
FIG. 4 is a top view of a mandrel layout used in a second illustrative embodiment of the invention.
Figure 5:
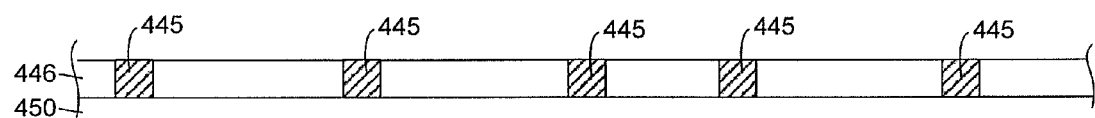
FIG. 5 a cross-section similar to that of FIG. 3G of a wiring layout formed using the mandrel layout of FIG. 4.

As will be apparent to those skilled in the art, numerous variations may be practiced within the spirit and scope of the present invention FIG. 4 is a top view, similar to FIG. 2, depicting the mandrel layout in a second illustrative embodiment of the invention. FIG. 5 is a cross-section, similar to FIG. 3G, depicting the final form of a metal routing made with the process of FIG. 1 operating on an initial mandrel layout as in FIG. 4. In FIGS. 4 and 5, like elements bear the same numbers increased by 200. The mandrel layout of FIG. 4 differs from that of FIG. 2 in that a change in spacing between adjacent mandrels is achieved without widening a mandrel but by shifting one group 470 of mandrels closer to a second group 480 of mandrels.

While the pluralities 210, 410 of mandrels have been shown as having uniform spacing d1 between adjacent mandrels, the invention may also be practiced where there are variations in this spacing. Likewise there may also be variations in the widths of the mandrels. Illustrative materials have been identified for the layers used in the practice of the invention; but numerous other materials may be used.

What is claimed is:

1. A method for forming a metal routing using self aligned double patterning comprising:

forming on a first work surface a plurality of elongated, substantially parallel mandrels, the mandrels being spaced apart a distance in a range between a theoretical resolution limit of the technology used to form the mandrels and twice the theoretical resolution limit;

forming spacers on the work surface, each spacer extending from a sidewall of one mandrel toward an adjacent mandrel, each spacer that is formed between a majority of mandrels having approximately the same extension s1 on the work surface from the sidewall of one mandrel toward the adjacent mandrel;

the distance between the sidewalls of two mandrels in the majority of mandrels having spacing that is greater than twice the extension s1, thereby exposing a first portion of the first work surface in a gap between the spacers that extend from the sidewalls of two adjacent mandrels toward each other; and the distance between the sidewalls of at least two adjacent mandrels being less than twice the extension s1 so that there is no gap between the spacers that extend from the sidewalls of these two adjacent mandrels;

removing the mandrels from the first work surface, thereby exposing second portions of the first work surface;

etching the exposed first and second portions of the first work surface down to a second work surface, thereby exposing portions of the second work surface;

etching the exposed portions of the second work surface to form trenches in the second work surface; and filling the trenches with a metal.

2. The method of claim 1 wherein the step of forming spacers comprises:

covering the mandrels and the surface of the first work surface between the mandrels with a spacer material; and removing a uniform thickness of the spacer material down to an upper surface of the mandrels and portions of the first work surface near the midpoints between a majority of adjacent mandrels.

3. The method of claim 1 wherein the first and second work surfaces are dielectric materials having different etching characteristics.

4. The method of claim 1 wherein the first work surface is a hard mask.

5. The method of claim 1 wherein the first work surface is silicon nitride.

6. The method of claim 1 wherein the second work surface is silicon dioxide.

7. The method of claim 1 wherein the metal is copper.

8. The method of claim 1 wherein the majority of mandrels have uniform spacing between them.

9. A method for forming metal routing using self aligned double patterning comprising:

forming on a first work surface a plurality of elongated, substantially parallel mandrels, the mandrels being spaced apart a distance in a range between a theoretical resolution limit of the technology used to form the mandrels and twice the theoretical resolution limit;

forming spacers on the work surface, each spacer extending from a sidewall of one mandrel toward an adjacent mandrel, the spacers that extend between a majority of adjacent mandrels having a gap between them near the midpoint between the adjacent mandrels that exposes a first portion of the first work surface and at least one pair of adjacent mandrels being close enough together that the spacers that extend between them extend continuously between the adjacent mandrels;

removing the mandrels from the first work surface, thereby exposing second portions of the first work surface;

etching the exposed first and second portions of the first work surface down to a second work surface, thereby exposing portions of the second work surface;

etching the exposed portions of the second work surface to form trenches in the second work surface; and filling the trenches with a metal.

10. The method of claim 9 wherein the step of forming spacers comprises:

covering the mandrels and the surface of the first work surface between the mandrels with a spacer material; and removing a uniform thickness of the spacer material down to an upper surface of the mandrels and portions of the first work surface near the midpoint between adjacent mandrels in the majority of mandrels.

11. The method of claim 9 wherein the first and second work surfaces are dielectric materials having different etching characteristics.

12. The method of claim 9 wherein the first work surface is a hard mask.

13. The method of claim 9 wherein the first work surface is silicon nitride.

14. The method of claim 9 wherein the second work surface is silicon dioxide.

15. The method of claim 9 wherein the metal is copper.

16. The method of claim 9 wherein the majority f mandrels have uniform spacing between them.

17. A wire routing formed by:

forming on a first work surface a plurality of elongated, substantially parallel mandrels, the mandrels being spaced apart a distance in a range between a theoretical resolution limit of the technology used to form the mandrels and twice the theoretical resolution limit;

forming spacers on the first work surface, each spacer extending from a sidewall of one mandrel toward an adjacent mandrel, the spacers that extend between a majority of adjacent mandrels having a gap between them near the midpoint between the adjacent mandrels that exposes a first portion of the first work surface and at least one pair of adjacent mandrels being close enough together that the spacers that extend between them extend continuously between the adjacent mandrels;

removing the mandrels from the first work surface, thereby exposing second portions of the first work surface;

etching the exposed first and second portions of the first work surface down to a second work surface, thereby exposing portions of the second work surface;

etching the exposed portions of the second work surface to form trenches in the second work surface; and filling the trenches with a metal.

18. The wire routing of claim 17 wherein the step of forming spacers comprises:

covering the mandrels and the surface of the first work surface between the mandrels with a spacer material; and removing a uniform thickness of the spacer material down to an upper surface of the mandrels and portions of the first work surface near the midpoint between the majority of adjacent mandrels.

19. The wire routing of claim 17 wherein the metal is copper.

20. The wire routing of claim 17 where the majority of mandrels have uniform spacing between them.

* * * * *